(12) United States Patent
Lim et al.

(10) Patent No.: US 11,201,197 B2
(45) Date of Patent: Dec. 14, 2021

(54) DISPLAY DEVICE INCLUDING A TRENCH AND MANUFACTURING METHOD THEREOF

(71) Applicant: LG Display Co., Ltd., Seoul (KR)

(72) Inventors: Hyeong-Jun Lim, Paju-si (KR); Doo-Hyn Yoon, Paju-si (KR); Han-Sun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/526,045

(22) Filed: Jul. 30, 2019

(65) Prior Publication Data
US 2020/0044001 A1 Feb. 6, 2020

(30) Foreign Application Priority Data
Jul. 31, 2018 (KR) .................. 10-2018-0089440

(51) Int. Cl.
| | |
|---|---|
| *H01L 27/32* | (2006.01) |
| *H01L 51/56* | (2006.01) |
| *G02B 27/01* | (2006.01) |
| *G06F 1/16* | (2006.01) |

(52) U.S. Cl.
CPC ...... *H01L 27/3246* (2013.01); *H01L 27/3258* (2013.01); *H01L 27/3276* (2013.01); *H01L 51/56* (2013.01); *G02B 27/0172* (2013.01); *G06F 1/163* (2013.01); *H01L 27/322* (2013.01); *H01L 2227/323* (2013.01)

(58) Field of Classification Search
CPC .................................................. H01L 27/3246
See application file for complete search history.

(56) References Cited

U.S. PATENT DOCUMENTS

| | | | |
|---|---|---|---|
| 2016/0293888 A1* | 10/2016 | Shim | ............... H01L 51/5228 |
| 2018/0114298 A1* | 4/2018 | Malaika | ............... G02B 27/017 |
| 2020/0119304 A1* | 4/2020 | Choi | ............... H01L 51/52 |

FOREIGN PATENT DOCUMENTS

| | | |
|---|---|---|
| KR | 10-2016-0072010 A | 6/2016 |
| KR | 10-2017-0124070 A | 11/2017 |
| KR | 10-2018-0013225 A | 2/2018 |
| KR | 10-2018-0013226 A | 2/2018 |

* cited by examiner

*Primary Examiner* — Suberr L Chi
(74) *Attorney, Agent, or Firm* — Morgan, Lewis & Bockius LLP (57) ABSTRACT

A display device includes: a substrate; a plurality of pixels on the substrate; an insulating film on the substrate; a bank on the insulating film, wherein the bank partitions the plurality of pixels; a first trench in the bank; and a second trench in the insulating film. A method of manufacturing a display device includes: forming a first lower metal layer and a second metal layer in patterns on a substrate; forming a first insulating film on the first lower metal layer and the second lower metal layer; forming a second insulating film on the first insulating film; forming a first trench to expose the second lower metal layer by performing a first etching process; and forming a second trench by performing a second etching process to etch the second lower metal layer exposed from a bottom of the first trench.

14 Claims, 12 Drawing Sheets

DISPLAY DEVICE INCLUDING A TRENCH AND MANUFACTURING METHOD THEREOF

This application claims the benefit of and priority to Korean Patent Application No. 10-2018-0089440, filed on Jul. 31, 2018, which is hereby incorporated by reference in its entirety as if fully set forth herein.

BACKGROUND

Technical Field

The present disclosure relates to a display device and manufacturing method thereof, and more particularly, to a display device in which electrodes can be easily formed and a manufacturing method thereof.

Discussion of the Related Art

With advancement in information-oriented societies, requirements for display devices that display an image have increased in various types. Recently, various display devices such as a liquid crystal display (LCD) device, plasma display panel (PDP) device, and organic light emitting display (OLED) device have been widely utilized. An OLED device is of a spontaneous emission type. An OLED device also has a viewing angle and a contrast ratio that are more desirable than those of an LCD. An OLED may also have a lower weight, a smaller thickness, and a lower power consumption because a separate backlight is not required. An OLED device may also be driven with a DC low voltage, may have a high response speed, and may have low manufacturing costs.

Head-mounted displays (HMDs) including an OLED device have been developed recently. An HMD device is a device that is worn in the form of eyeglasses or a helmet for virtual reality (VR) or augmented reality (AR) in which a focus is formed at a position close to a user's eyes. However, in such a head-mounted display with an ultrahigh definition, there is a problem in that it is difficult to form electrodes included in pixels in patterns due to minute pixel pitches.

SUMMARY

Accordingly, the present disclosure is directed to a display device and a manufacturing method thereof that substantially obviate one or more of the above-identified problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, there is provided a display device comprising: a substrate; a plurality of pixels on the substrate; an insulating film on the substrate; a bank on the insulating film, wherein the bank partitions the plurality of pixels; a first trench in the bank; and a second trench in the insulating film, wherein the first trench has a first width, and the second trench has a second width greater than the first width.

Additionally, there is provided a method of manufacturing a display device, comprising: forming a first lower metal layer and a second metal layer in patterns on a substrate; forming a first insulating film on the first lower metal layer and the second lower metal layer; forming a second insulating film on the first insulating film; forming a first trench to expose the second lower metal layer by performing a first etching process; and forming a second trench by performing a second etching process to etch the second lower metal layer exposed from a bottom of the first trench.

According to the present disclosure, a first electrode and a light emitting layer may be self-aligned by trenches and may be formed by pixels. Accordingly, because the first electrode may be formed without using a particular mask, it is possible to simplify manufacturing processes and reduce process costs. Because the first electrode may be formed without performing any particular etching process, the first electrode can also be formed of a metal material having high etching resistance such as silver (Ag).

Because the first electrode may also be formed on the side surface of the bank, light propagating to the bank can be reflected upward. Accordingly, it is possible to reduce loss of light that is emitted from the light emitting layer. Because the light emitting layer may be cut off in a trench, it is possible to minimize or reduce an influence of a leakage current from the light emitting layer on a neighboring pixel. Because the bank may be formed after the trench has been formed, it is possible to minimize or reduce the top area of the bank. Accordingly, it is possible to maximize an aperture ratio of a pixel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate example embodiments of the disclosure and together with the description serve to explain the principles of the disclosure. In the drawings.

DETAILED DESCRIPTION

Reference will now be made in detail to the example embodiments of the present disclosure, examples of which may be illustrated in the accompanying drawings. Wherever possible, the same reference numbers will be used throughout the drawings to refer to the same or like parts. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

A shape, a size, a ratio, an angle, and a number disclosed in the drawings for describing example embodiments of the present disclosure are merely examples, thus the present disclosure is not limited to the illustrated details. Like reference numerals refer to like elements throughout. In the following description, when the detailed description of the relevant known technology unnecessarily obscures important points of the present disclosure, the detailed description may be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a positional relation between two parts is described as 'on~', 'over~', 'under~', and 'next~', one or more other parts may be disposed between the two parts unless 'just' or 'direct' is used.

Although the terms "first," "second," etc. may be used in the present disclosure to describe various elements, these elements should not be limited by these terms. These terms may be used to distinguish one element from another. For example, a first element may be termed a second element, and, similarly, a second element may be termed a first element, without departing from the scope of the present disclosure.

Terms such as first and second can be used to describe elements of the present disclosure. These terms are only used to distinguish one element form another element, and essentials, sequences, orders, or numbers of the elements are not limited by the terms. When an element is described as being "connected," "coupled," or "linked" to another element, it should be understood that the element may be connected to coupled directly to another element, still another element may be "interposed" between the elements, or the elements may be "connected," "coupled," or "linked" to each other via still another element.

Features of various example embodiments of the present disclosure may be partially or overall coupled to or combined with each other, and may be variously inter-operated with each other. The example embodiments of the present disclosure may be carried out independently from each other, or may be carried out together in co-dependent relationship. Although the same elements may be illustrated in multiple drawings, like reference numerals may refer to like elements. Also, for convenience of description, a scale of each of elements illustrated in the accompanying drawings may differ from a real scale, and thus, is not limited to the scales illustrated in the drawings.

Figure 1:
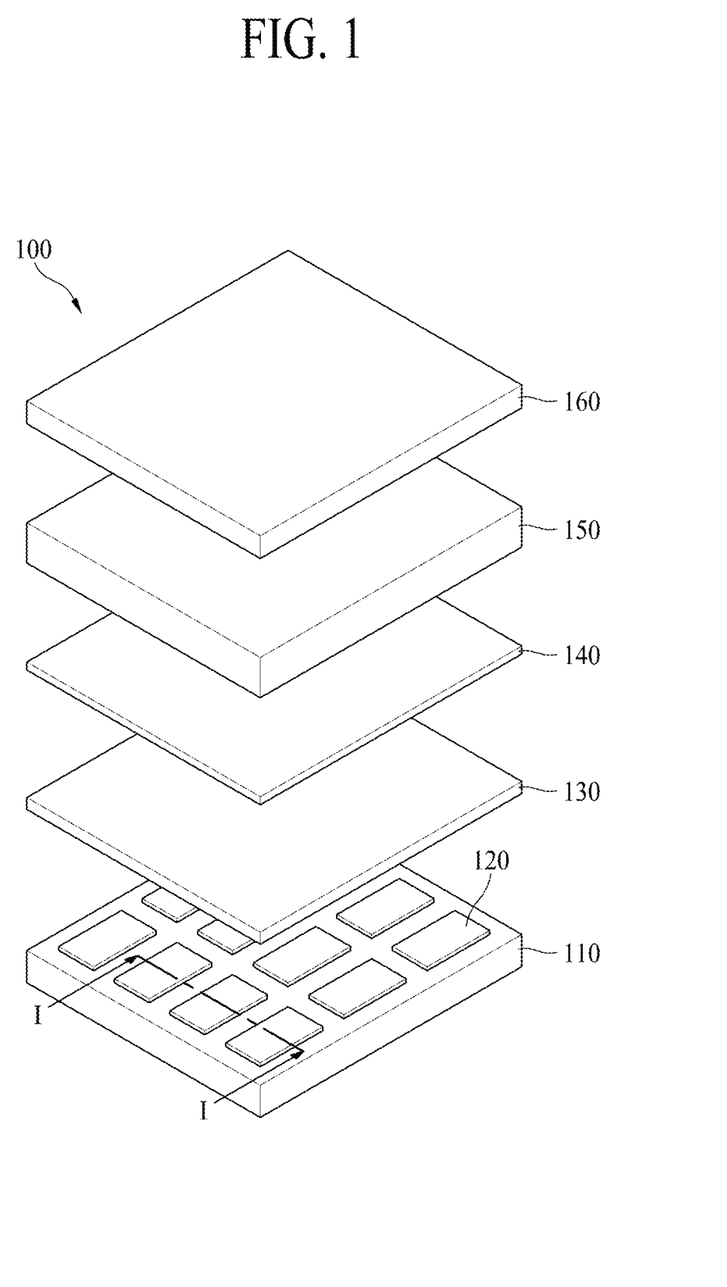
FIG. 1 illustrates a display device according to an example embodiment of the present disclosure.
Figure 2:
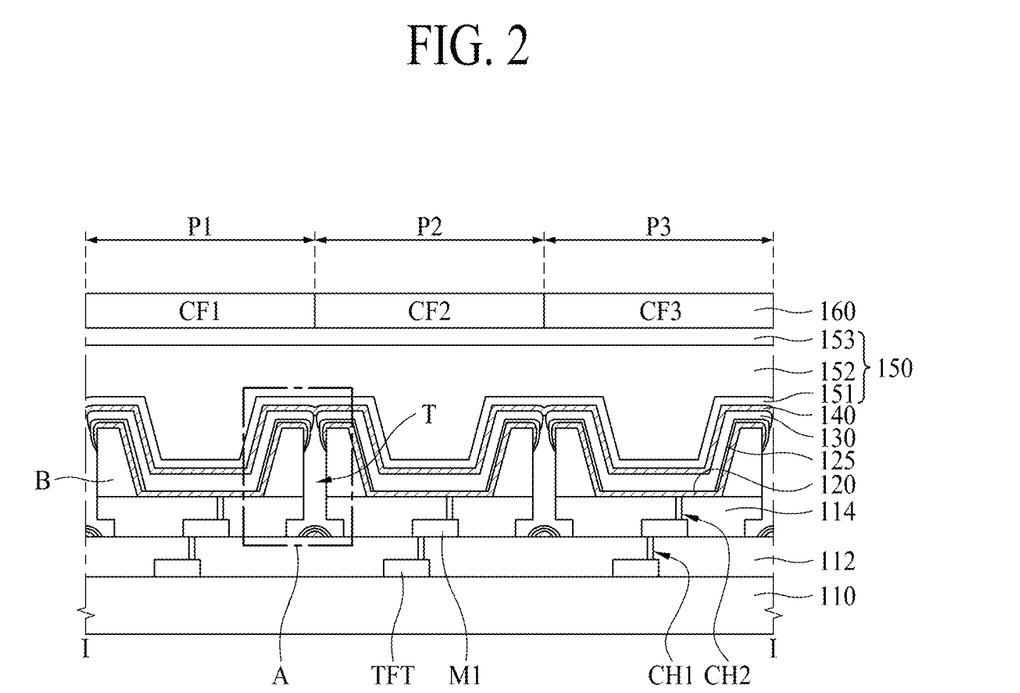
FIG. 2 is a cross-sectional view taken along line I-I in FIG. 1.
Figure 3:
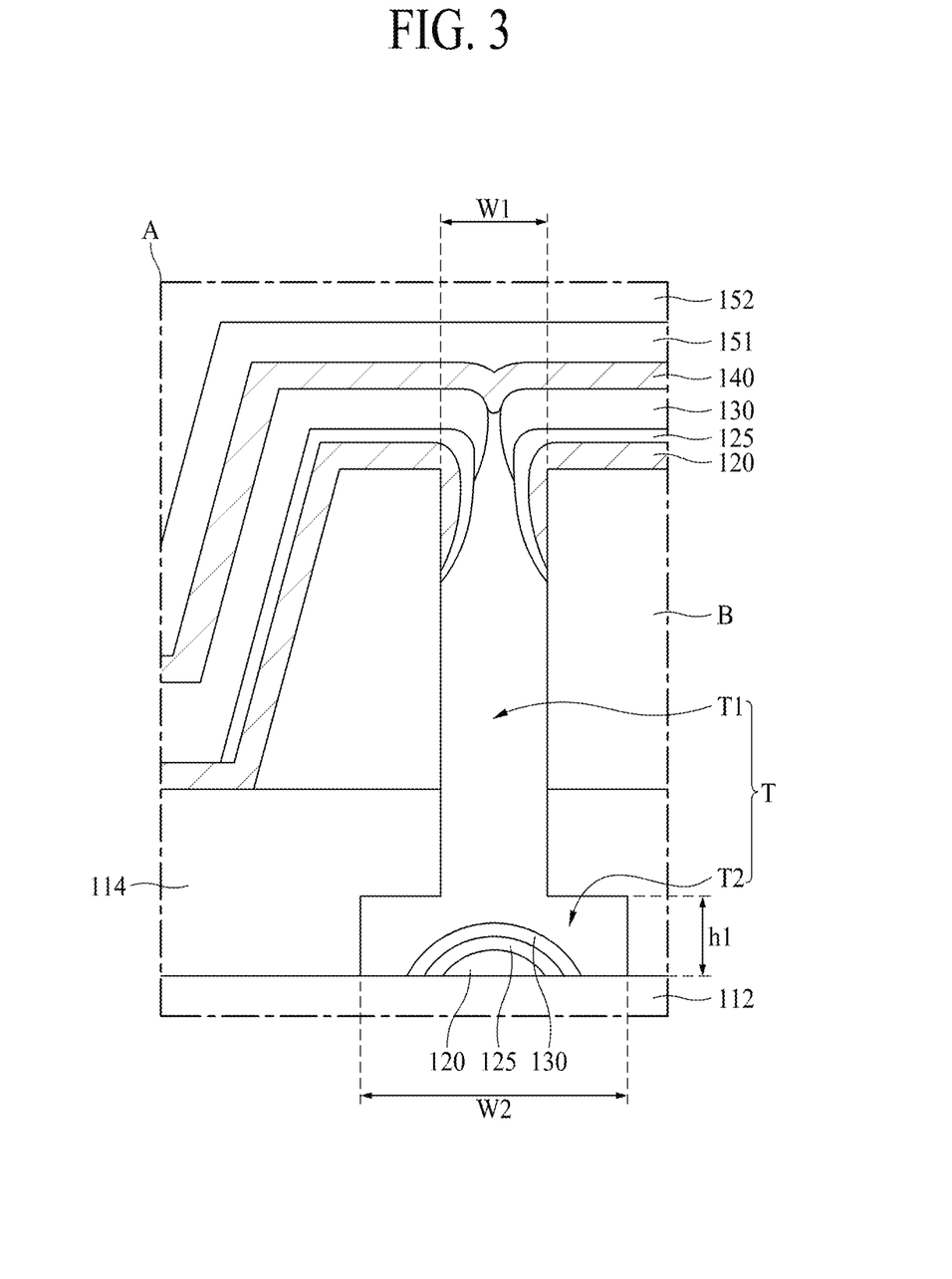
FIG. 3 is an enlarged cross-sectional view illustrating an example of Area A in FIG. 2.
Figure 4:
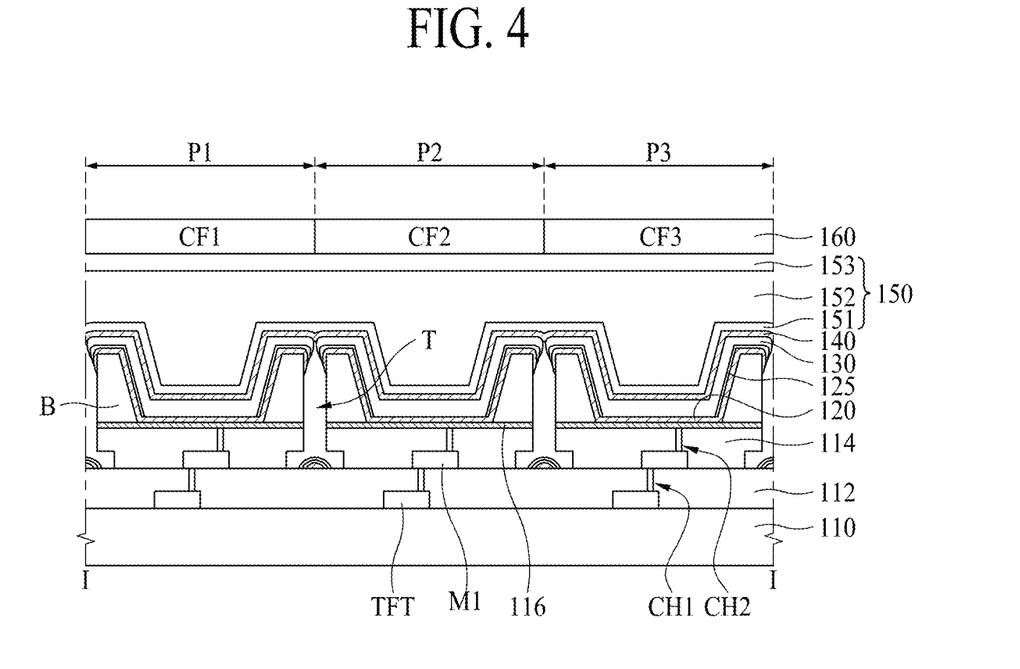
FIG. 4 is a cross-sectional view illustrating a modified example of FIG. 2.
Figure 5:
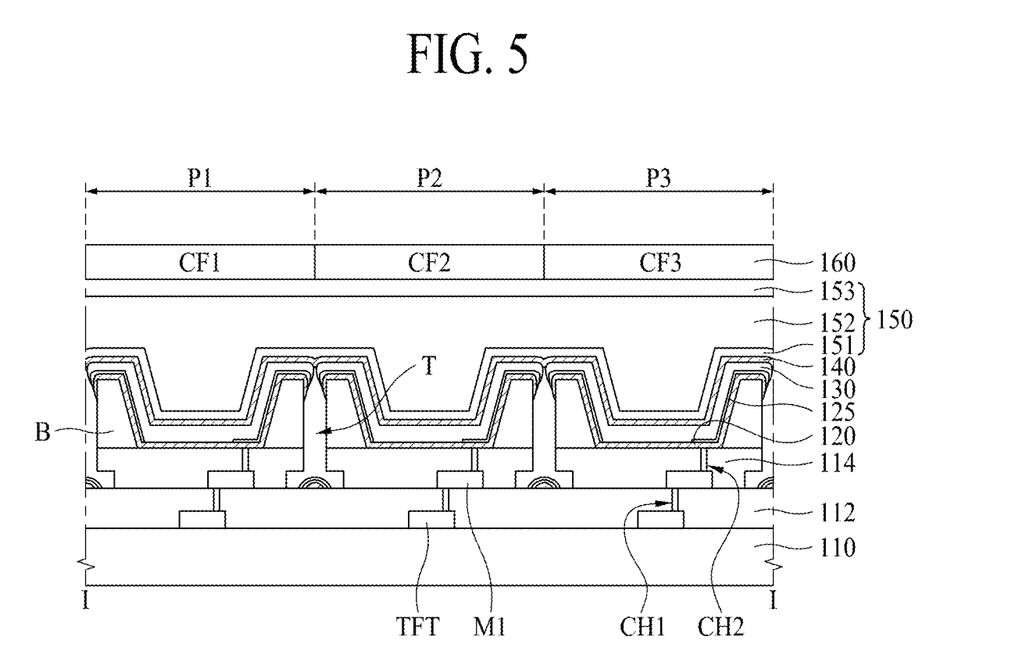
FIG. 5 is a cross-sectional view illustrating another modified example of FIG. 2.
Figure 6:
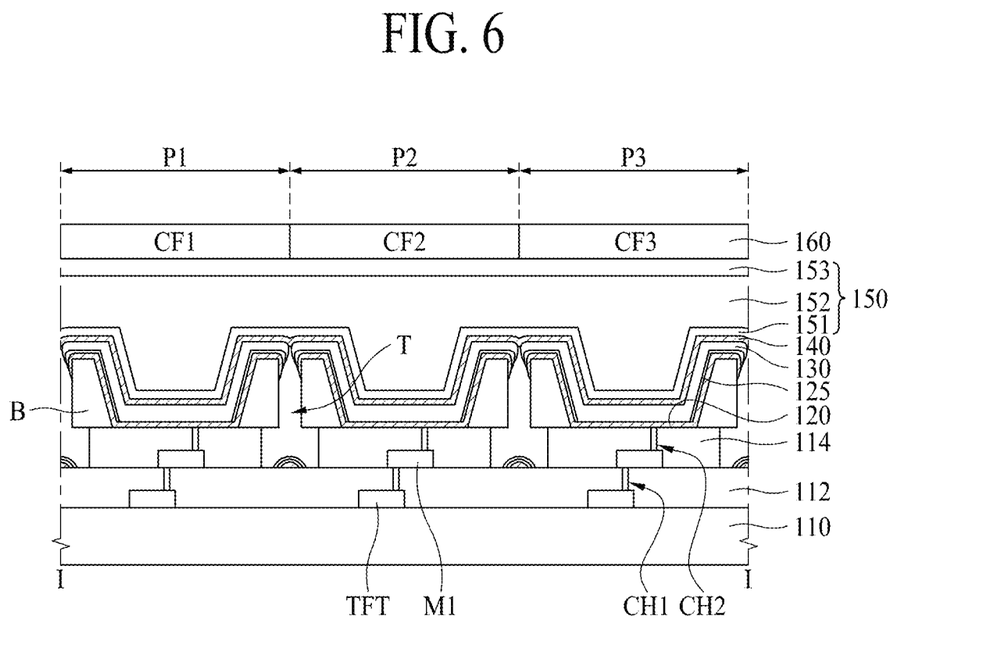
FIG. 6 is a cross-sectional view illustrating another modified example of FIG. 2.

FIG. 1 illustrates a display device according to an example embodiment of the present disclosure. FIG. 2 is a cross-sectional view taken along line I-I in FIG. 1. FIG. 3 is an enlarged cross-sectional view illustrating an example of Area A in FIG. 2. FIG. 4 is a cross-sectional view illustrating a modified example of FIG. 2. FIG. 5 is a cross-sectional view illustrating another modified example of FIG. 2. FIG. 6 is a cross-sectional view illustrating another modified example of FIG. 2.

As illustrated in FIGS. 1 to 3, a display device 100 may include a substrate 110, a driving thin-film transistor TFT, a first insulating film 112, a first lower metal layer M1, a second insulating film 114, a first electrode 120, a light emitting layer 130, a second electrode 140, a bank B, a first trench T1, a second trench T2, an encapsulation film 150, and a color filter 160. The substrate 110 may be a plastic film, a glass substrate, or a silicon wafer substrate that may be formed using a semiconductor process. The substrate 110 may be formed of a transparent material or may be formed of an opaque material. A first pixel P1 that emits red light, a second pixel P2 that emits green light, and a third pixel P3 that emits blue light may be on the substrate 110. A fourth pixel that emits white light may be on the substrate 110.

An electroluminescence display device may employ a so-called top emission system in which emitted light may be discharged to the top side, and thus an opaque material as well as a transparent material can be used as the material of the substrate 110. Circuit elements including various signal lines, thin-film transistors, and capacitors may be on the substrate 110 for each of the pixels P1, P2, and P3. The signal lines may include a gate line, a data line, a power supply line, and a reference line. The thin-film transistors may be a switching thin-film transistor, a driving thin-film transistor TFT, or a sensing thin-film transistor.

The switching thin-film transistor may be switched in accordance with a gate signal that may be supplied to the gate line and serves to supply a data voltage from the data line to the driving thin-film transistor. The driving thin-film transistor TFT may be switched in accordance with the data voltage supplied from the switching thin-film transistor and may generate a data current from a power supplied via the power supply line to the generated data current to the first electrode 120. The sensing thin-film transistor serves to sense a threshold voltage deviation of the driving thin-film transistor causing degradation in image quality, and may supply a current of the driving thin-film transistor to the reference line in response to a sensing control signal that may be supplied from the gate line or a particular sensing line.

The capacitor may hold the data voltage supplied to the driving thin-film transistor TFT during one frame, and may be connected to the gate terminal and the source terminal of the driving thin-film transistor TFT. The first insulating film 112 may be on the circuit elements, including the driving thin-film transistor TFT. The first insulating film 112 may be formed of an inorganic film such as a silicon oxide film (SiOx), a silicon nitride film (SiNx), or a multilayered film thereof.

The first lower metal layer M1 may be on the first insulating film 112 for each of the pixels P1, P2, and P3. The first lower metal layer M1 may be connected to the driving thin-film transistor TFT via the first contact portion CH1 penetrating the first insulating film 112. The first contact portion CH1 may be in an emission area as illustrated in FIG. 2. For example, the first contact portion CH1 may be in a non-emission area. The second insulating film 114 may be on the first lower metal layer M1. The second insulating film 114 may be formed of an inorganic film such as a silicon oxide film (SiOx), a silicon nitride film (SiNx), or a multi-layered film thereof.

Although not illustrated in FIG. 2, an etching preventing layer 116 may be on the second insulating film 114, as illustrated in FIG. 4. The etching preventing layer 116 prevents the gate lines, the data lines, the driving thin-film transistor TFT, and the first lower metal layer M1 from being damaged by an etchant after the second insulating film 114 has been formed. The etching preventing layer 116 may be formed in a double-layer structure of titanium (Ti) and titanium nitride (TiN). The etching preventing layer 116 may be electrically connected to the first electrode 120 and the first lower metal layer M1, and can also serve as a buffer electrode.

The bank B may be on the second insulating film 114. The bank B may be in a matrix structure at boundaries between a plurality of pixels P1, P2, and P3, and may partition the plurality of pixels P1, P2, and P3. The bank B may be formed of an inorganic film such as a silicon oxide film (SiOx), a silicon nitride film (SiNx), or a multilayered film thereof. The bank B may be formed of an organic film such as an acryl resin, an epoxy resin, a phenolic resin, a polyamide resin, and/or a polyimide resin.

The trench T may be in the bank B and the second insulating film 114. The trench T includes a first trench T1 and a second trench T2, as illustrated in FIG. 3. The first trench T1 may be in the bank B. Specifically, the first trench T1 may be formed to penetrate the bank B from the top surface of the bank B to the bottom of the bank B with a first width W1. The first trench T1 may be formed in a part of the second insulating film 114. Specifically, the first trench T1 may be formed in the second insulating film 114 from the top surface of the second insulating film 114 to a first height h1 of the second insulating film 114 with the first width W1.

The second trench T2 may be formed in the second insulating film 114. The second trench T2 may be formed in the second insulating film 114 from the first height h1 of the second insulating film 114 to the bottom surface of the second insulating film 114 with a second width W2. The second width W2 may be greater than the first width W1. The second trench T2 may be formed under the first trench T1. The second trench T2 may be formed with the second width W2, which may be greater than the first width W1 of the first trench T1. Accordingly, the trench T may have an undercut structure.

The second trench T2 may be in the same layer as the first lower metal layer M1 and may have substantially the same height as the first lower metal layer M1. The second trench T2 may be formed using a second lower metal layer (not illustrated). The second lower metal layer may be formed on the first insulating film 112 at substantially the same time as forming the first lower metal layer M1. The second lower metal layer may have the second width W2.

Thereafter, insulating materials for forming the second insulating film 114 and the bank B may be sequentially formed on the first lower metal layer M1 and the second lower metal layer. Then, the insulating material for forming the bank B and the second insulating film 114 may be etched by performing a first etching process. Accordingly, the second lower metal layer may be exposed and the first trench T1 may be formed.

Then, the second lower metal layer may be etched by performing a second etching process that may be performed using an etchant that can etch the second lower metal layer but cannot etch the second insulating film 114. Accordingly, only the second lower metal layer, but not the second insulating film 114, may be etched to form the second trench T2. As a result, the second trench T2 may be formed to have substantially the same shape as the second lower metal layer formed on the first insulating film 112 at substantially the same time as forming the first lower metal layer M1.

On the other hand, in FIG. 2, the first trench T1 may penetrate a part of the second insulating film 114. The first trench T1 may be formed in the bank B depending on a manufacturing method, as illustrated in FIG. 6. For example, the first trench T1 may penetrate the top surface of the bank B to the bottom surface of the bank B, and the second trench T2 may penetrate from the top surface of the second insulating film 114 to the bottom surface of the second insulating film 114.

The first electrode 120 may be on the second insulating film 114 and the bank B. The first electrode 120 may be provided for each of the pixels P1, P2, and P3, and may serve as an anode of the display device 100. The first electrode 120 may be connected to the first lower metal layer M1 via a second contact portion CH2. The first electrode 120 may be formed on the second insulating film 114 that may be exposed without forming the bank B thereon, and may be also formed on the side surface and the top surface of the bank B. The first electrode 120 formed on the second insulating film 114 and the first electrode 120 formed on the side surface and the top surface of the bank B may be connected to each other. A portion of the first electrode 120 may be on the side surface and the top surface of the bank B to prevent or reduce loss of light emitted from the light emitting layer 130. Some light emitted from the light emitting layer 130 may propagate to the bank B. The first electrode 120 may reflect light propagating to the bank B upward.

The first electrode 120 may also be in the trench T. The first electrode 120 may be formed in a part of the side surface of the first trench T. A material of the first electrode 120 may also be formed in a part of the bottom surface of the second trench T2. The first electrode 120 formed in a part of the bottom surface of the second trench T2 may not be connected to the material of the first electrode 120 formed in a part of the side surface of the first trench T1, but may be separated therefrom. That is, the first electrodes 120 in the pixels P1, P2, and P3 that may be adjacent to each other with the trench T interposed therebetween, may not be connected to each other, but separated from each other.

The first electrode 120 may be in the plurality of pixels P1, P2, and P3 without using a particular mask. The first electrode 120 may be self-aligned by the trench T and may be formed for each of the pixels P1, P2, and P3. Because the first electrode 120 may be formed without using a particular etching process, the first electrode may also be formed of a metal material having high etching resistance such as silver (Ag). The first electrode 120 may be formed of a metal material having high reflectance such as silver (Ag). That is, the first electrode 120 may be formed of a metal material having high reflectance such as a stacked structure (Ti/Al/Ti) of aluminum and titanium, a stacked structure (ITO/Al/ITO) of aluminum and ITO, an APC alloy, or a stacked structure (ITO/APC/ITO) of an APC alloy and ITO. The APC alloy may be an alloy of silver (Ag), palladium (Pd), and/or copper (Cu).

The light emitting layer 130 may be on the first electrode 120. The light emitting layer 130 may include a hole transporting layer, a light emitting layer, and an electron transporting layer. When a voltage is applied to the first electrode 120 and the second electrode 140, holes and electrons may move to the light emitting layer via the hole transporting layer and the electron transporting layer, respectively, and may be combined in the light emitting layer to emit light. The light emitting layer 130 may be a white light emitting layer. The light emitting layer 130 may be a common layer that is provided commonly to the pixels P1, P2, and P3.

When the light emitting layer 130 is a white light emitting layer, the light emitting layer 130 may be formed in a tandem structure of two or more stacks. Each stack may include a hole transporting layer, at least one light emitting layer, and an electron transporting layer. A charge generating layer may be between the stacks. The charge generating layer may include an n-type charge generating layer that may be located adjacent to a lower stack, and a p-type charge generating layer that may be on the n-type charge generating layer and may be located adjacent to an upper stack. The n-type charge generating layer may inject electrons to the lower stack, and the p-type charge generating layer may inject holes to the upper stack. The n-type charge generating layer may be formed of an organic layer that may be doped with an alkali metal such as Li, Na, K, and/or Cs or an alkali earth metal such as Mg, Sr, Ba, and/or Ra. The p-type charge generating layer may be formed of an organic material having hole transportability that may be doped with a dopant.

The light emitting layer 130 may be on the first electrode 120 that is on the second insulating film 114. A portion of the light emitting layer 130 may also be on the portion of the first electrode 120 that is on the side surface and the top surface of the bank B. The light emitting layer 130 on the second insulating film 114 and the light emitting layer 130 on the side surface and the top surface of the bank B may be connected to each other. The light emitting layer 130 may also be in the trench T. The light emitting layer 130 may be formed in a part of the side surface of the first trench T1. A material of the light emitting layer 130 may also be formed in a part of the bottom surface of the second trench T2. The material of the light emitting layer 130 formed in a part of the bottom surface of the second trench T2 may not be connected to the light emitting layer 130 formed in a part of the side surface of the first trench T1, but may be separated therefrom. Because the pixels P1, P2, and P3 that may be adjacent to each other with the trench T interposed therebetween may be separated from each other, charge cannot move via the charge generating layer between the adjacent pixels P1, P2, and P3. With this light emitting layer 130, it is possible to minimize or reduce an influence of a leakage current on the adjacent pixels.

The light emitting layer 130 may be in the plurality of pixels P1, P2, and P3 without using a particular mask. The light emitting layer 130 may be self-aligned by the trench T and may be formed for each of the pixels P1, P2, and P3. On the other hand, in FIG. 2, the light emitting layer 130 is illustrated as a common layer that may be provided commonly to the plurality of pixels P1, P2, and P3. The light emitting layer 130 may include a red light emitting layer that emits red light, a green light emitting layer that emits green light, and a blue light emitting layer that emits blue light. The light emitting layer 130 may be provided as patterns in the pixels P1, P2, and P3. For example, a red light emitting layer may be pattern-formed in the first pixel P1, a green light emitting layer may be pattern-formed in the second pixel P2, and a blue light emitting layer may be pattern-formed in the third pixel P3.

The second electrode 140 may be on the light emitting layer 130. The second electrode 140 may be a common layer that may be provided commonly to the pixels P1, P2, and P3. The second electrode 140 may be formed of a transparent conductive material (TCO) such as ITO or IZO that can transmit light or a semi-transmissive conductive material such as magnesium (Mg), silver (Ag), or an alloy of magnesium (Mg) and silver (Ag).

The encapsulation film 150 may cover the second electrode 140. The encapsulation film 150 may prevent or reduce oxygen or moisture from permeating the light emitting layer 130 and the second electrode 140. Therefore, the encapsulation film 150 may include at least one inorganic film and at least one organic film. Specifically, the encapsulation film 150 may include a first inorganic film 151 and an organic film 152. For example, the encapsulation film 150 may further include a second inorganic film 153. The first inorganic film 151 may cover the second electrode 140. The organic film 152 may be on the first inorganic film 151 and be long enough to prevent or reduce particles from permeating the light emitting layer 130 and the second electrode 140 via the first inorganic film 151. The second inorganic film 153 may cover the organic film 152.

Each of the first and second inorganic films 151 and 153 may be formed of silicon nitride, aluminum nitride, zirconium nitride, titanium nitride, hafnium nitride tantalum nitride, silicon oxide, aluminum oxide, and/or titanium oxide. The first and second inorganic films 151 and 153 may be formed using a chemical vapor deposition (CVD) method or an atomic layer deposition (ALD) method. The organic film 152 may be formed of an acryl resin, an epoxy resin, a phenolic resin, a polyamide resin, and/or a polyimide resin. The organic film 152 may be formed using a vapor deposition method, a printing method, or a slit coating method using an organic material. The organic film 152 may be formed using an ink-jet method.

The color filter 160 may be on the encapsulation film 150. The color filter 160 includes a first color filter CF1, a second color filter CF2, and a third color filter CF3, that may correspond to the pixels P1, P2, and P3. The first color filter CF1 may be a red color filter that transmits red light, the second color filter CF2 may be a green color filter that transmits green light, and the third color filter CF3 may be a blue color filter that transmits blue light.

The display device 100 may further include a fourth insulating film 125, as illustrated in FIG. 2. The fourth insulating film 125 may be between the first electrode 120 and the light emitting layer 130. For example, the light emitting layer 130 may be on the first electrode 120 that is on the side surface and the top surface of the bank B, and may cover the end of the first electrode 120. Accordingly, it is possible to mitigate the problem of a current being concentrated to the end of the first electrode 120 to degrade emission efficiency. In each of the pixels P1, P2, and P3, an emission area may be defined by the fourth insulating film 125 and the bank B. An area in which at least one of the fourth insulating film 125 and the bank B is disposed may be a non-emission area, and an area in which none of the fourth insulating film 125 and the bank B may be disposed may be an emission area.

In FIG. 2, the second contact portion CH2 may be disposed in each emission area of the pixels P1, P2, and P3. For example, the second contact portion CH2 may be disposed in the non-emission area, as illustrated in FIG. 5. In the pixels P1, P2, and P3, a step difference may occur due to the second contact portion CH2. When the second contact portion CH2 may be disposed in the emission area, there may be a problem in that light may be non-uniformly emitted in the emission area due to such a step difference. In order to prevent or reduce occurrence of such a problem, the second contact portion CH2 is disposed in the non-emission area.

The second contact portion CH2 may be disposed below the fourth insulating film 125. The fourth insulating film 125 may be on the bank B and may also be formed in a part of the second insulating film 114 on which the bank B is not formed. The fourth insulating film 125 may be formed to extend to a part of the second insulating film 114 on which the bank B is not formed, and along the side surface of the bank B. The second contact portion CH2 may be below the fourth insulating film 125 formed in a part of the second insulating film 114 on which the bank B is not formed, as illustrated in FIG. 5.

Although not illustrated in FIG. 5, the second contact portion CH2 may be below the bank B. The width of the bank B may be increased to cover the second contact portion CH2, thus the aperture ratio of the pixels P1, P2, and P3 may be decreased. In the display device 100, because the trench T may be formed in the bank B and the second insulating film 114, the width of the bank B can be increased such that the trench T and the second contact portion CH2 do not overlap each other.

Figure 7:
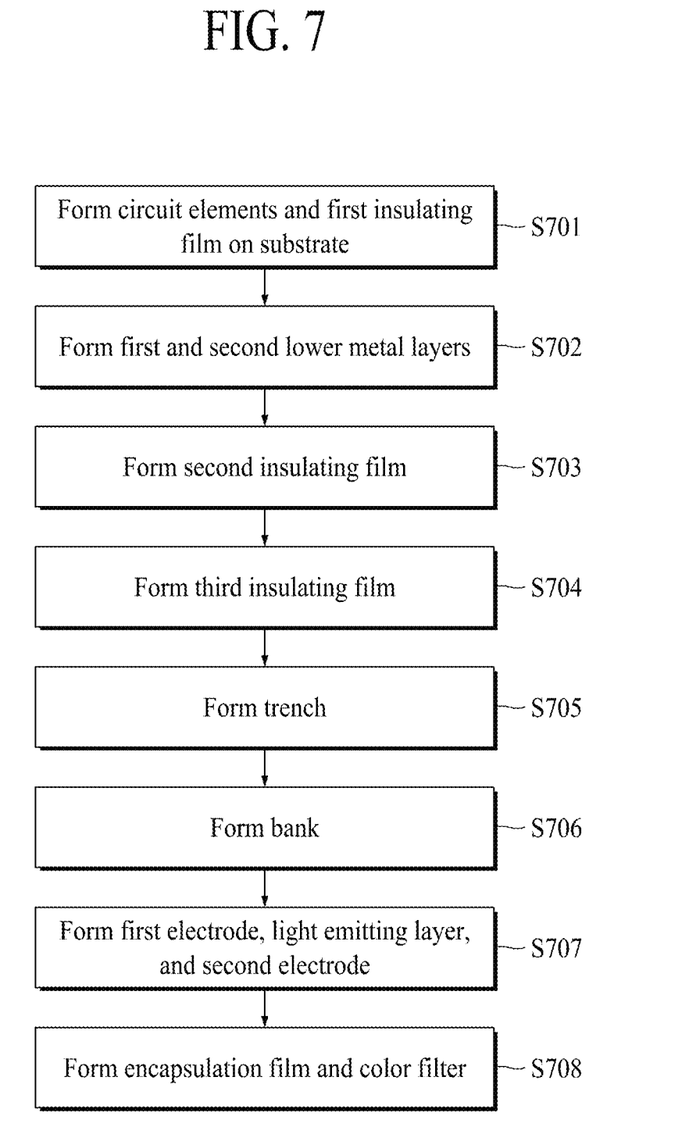
FIG. 7 is a flowchart illustrating a method of manufacturing a display device according to an example embodiment of the present disclosure.
Figure 8A:
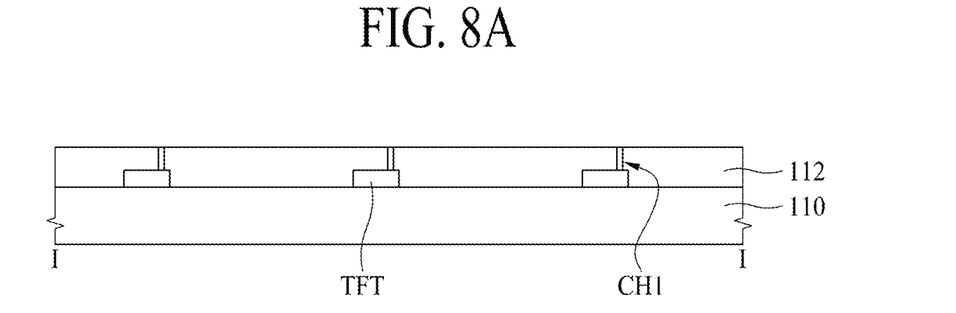
FIGS. 8A to 8I are cross-sectional views illustrating the method of manufacturing the display device according to an example embodiment of the present disclosure.

FIG. 7 is a flowchart illustrating a method of manufacturing a display device according to an example embodiment of the present disclosure. FIGS. 8A to 8I are cross-sectional views illustrating the method of manufacturing the display device according to an example embodiment of the present disclosure. First, circuit elements and the first insulating film 112 may be formed on the substrate 110 (S701). For example, the driving thin-film transistor TFT may be formed on the substrate 110, as illustrated in FIG. 8A. Then, the first insulating film 112 may be formed on the driving thin-film transistor TFT. The first insulating film 112 may be formed of, for example, an inorganic film such as a silicon oxide film (SiOx), a silicon nitride film (SiNx), or a multilayered film thereof. Then, the first contact portion CH1 that penetrates the first insulating film 112 and is connected to the driving thin-film transistor TFT may be formed.

Figure 8B:
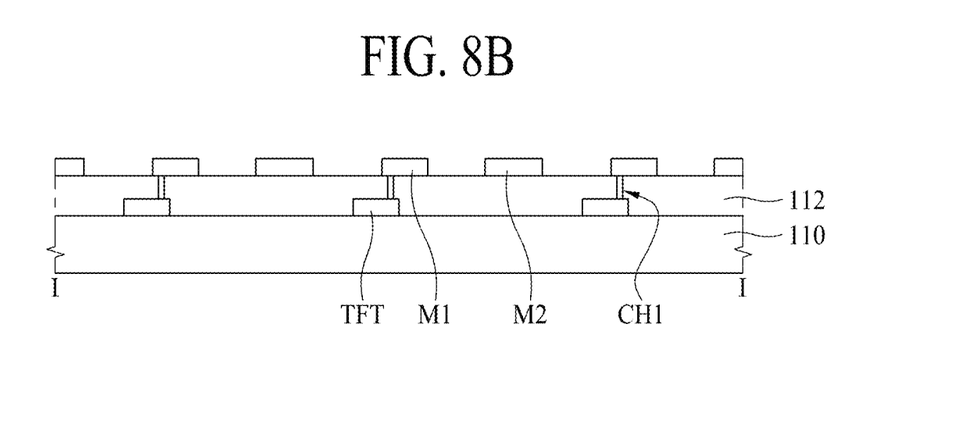

Then, the first and second lower metal layers M1 and M2 may be formed on the first insulating film 112 (S702). For example, a lower metal film may be formed on the first insulating film 112. Then, a photoresist pattern may be formed on the lower metal film. The lower metal film that is not covered by the photoresist pattern may be dry-etched to form the first lower metal layer M1 and the second lower metal layer M2, as illustrated in FIG. 8B, and the photoresist pattern may be removed. Then, the second insulating film 114 may be formed on the first and second lower metal layers M1 and M2 (S703).

Figure 8C:
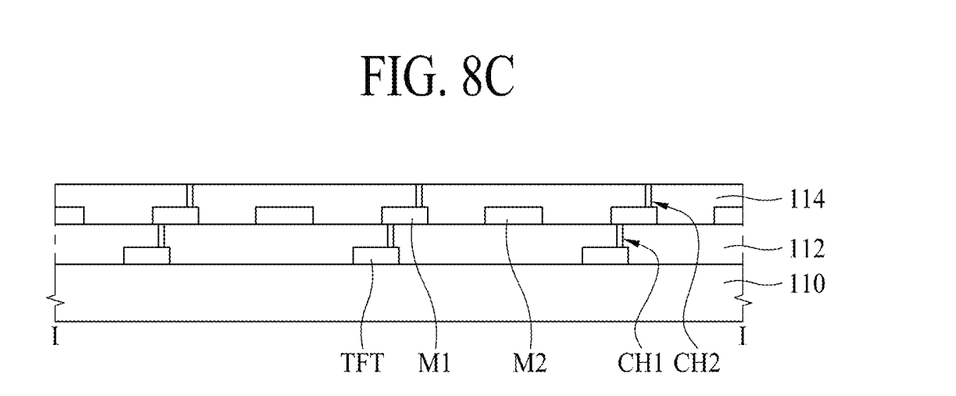
Figure 8D:
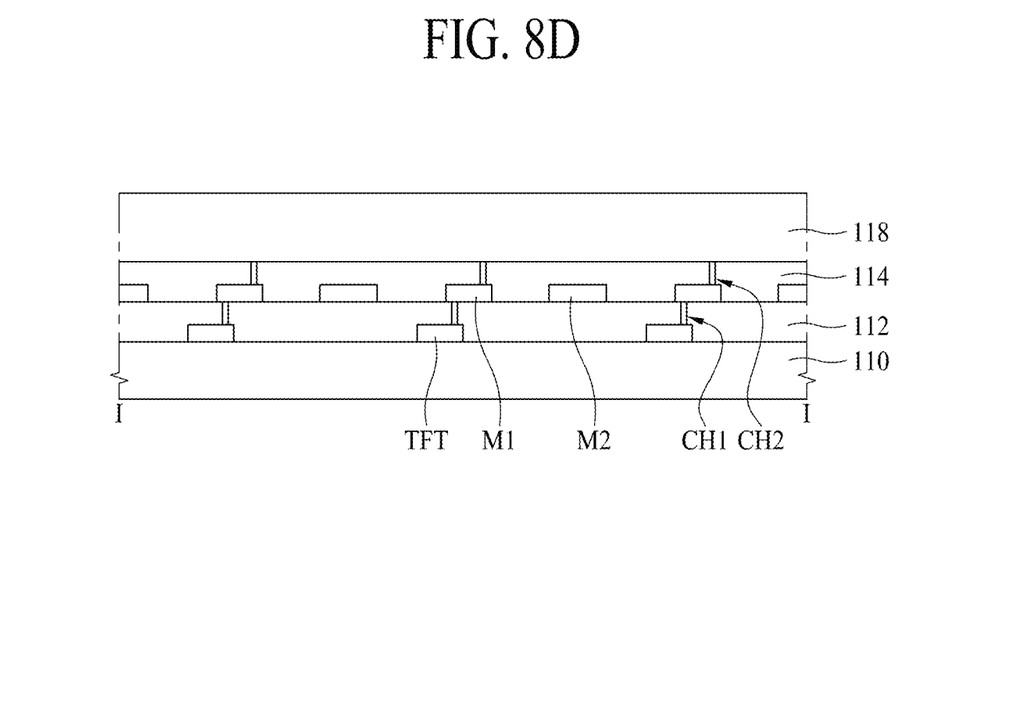

For example, the second insulating film 114 may be formed on the first and second lower metal layers M1 and M2, as illustrated in FIG. 8C. The second insulating film 114 may be formed of, for example, an inorganic film such as a silicon oxide film (SiOx), a silicon nitride film (SiNx), or a multilayered film thereof. Then, the second contact portion CH2 that penetrates the second insulating film 114 and is connected to the first lower metal layer M1 may be formed. Then, a third insulating film 118 may be formed on the second insulating film 114. For example, the third insulating film 118 may be formed on the second insulating film 114, as illustrated in FIG. 8D. The third insulating film 118 may be formed of, for example, an inorganic film such as a silicon oxide film (SiOx), a silicon nitride film (SiNx), or a multilayered film thereof. The third insulating film 118 may be formed of an organic film such as an acryl resin, an epoxy resin, a phenolic resin, a polyamide resin, and/or a polyimide resin.

Figure 8E:
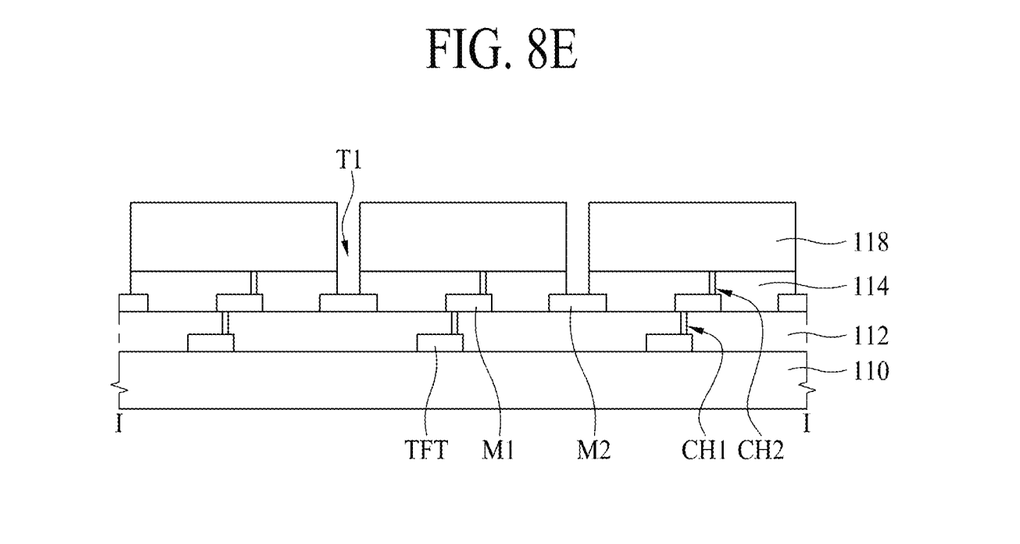
Figure 8F:
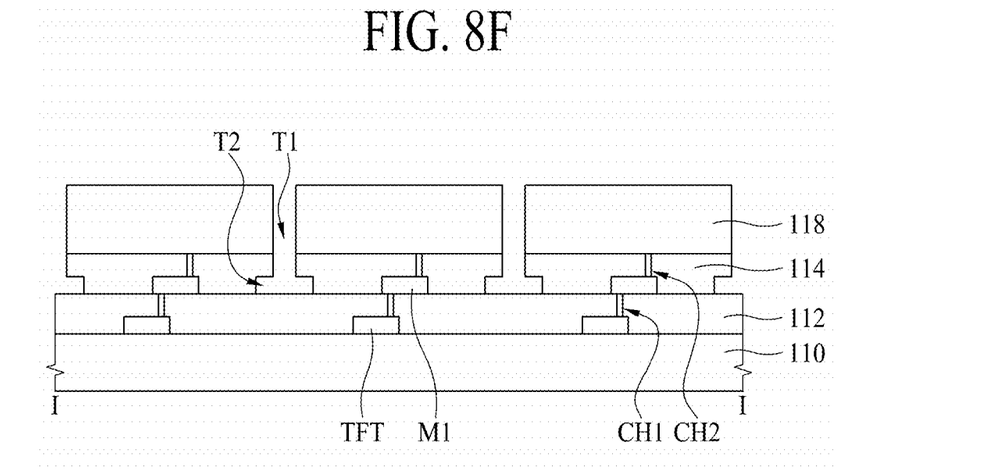

Then, the trench T may be formed in the second insulating film 114 and the third insulating film 118 (S705). For example, the first trench T1 may be formed in a part of the third insulating film 118 and the second insulating film 114 by performing the first etching process, as illustrated in FIG. 8E. The first etching process may be a dry etching process. The first etching process may etch the third insulating film 118 with the first width W1. Then, the second insulating film 114 may be etched with the first width W1 to expose the second lower metal layer M2. The first trench T1 may be formed while exposing the second lower metal layer M2. Then, the second trench T2 may be formed by performing the second etching process, as illustrated in FIG. 8F. The second etching process may be a wet etching process and may be performed using an etchant that can etch the second lower metal layer M2 but cannot etch the second insulating film 114. Accordingly, the second insulating film 114 may not be etched and only the second lower metal layer M2 may be etched to form the second trench T2. The second trench T2 has a second width W2, which may be greater than the first width W1.

Figure 8G:
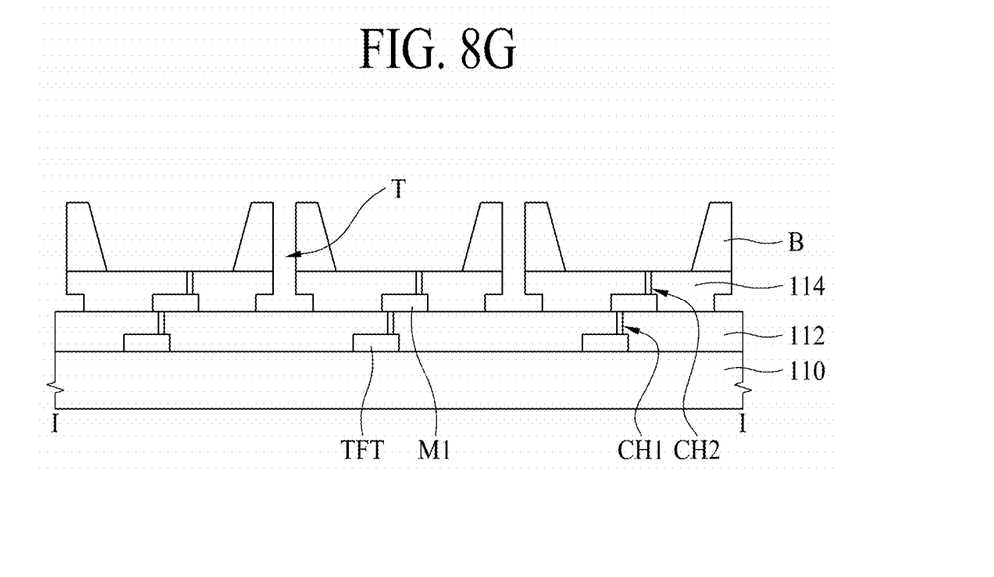

Then, the bank B may be formed (S706). For example, the bank B may be formed by performing a third etching process, as illustrated in FIG. 8G. A photoresist pattern may be formed on the third insulating film 118. The photoresist pattern may be formed at the position at which the trench T is formed. The bank B may be formed, as illustrated in FIG. 8G, by dry-etching the third insulating film 118 that may not be covered by the photoresist pattern, and the photoresist pattern may be removed. The photoresist pattern may have a shape that is convex upward, and the bank B may have an inclined surface.

Figure 8H:
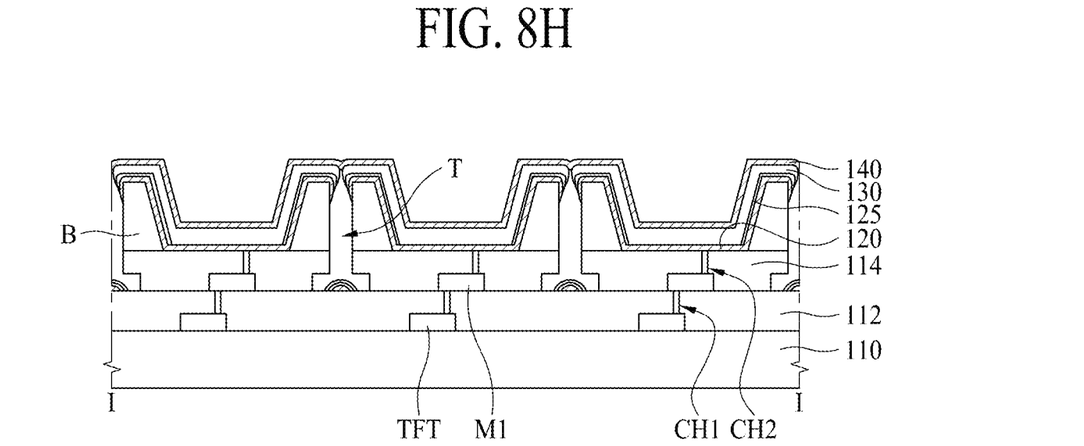

Then, the first electrode 120, the light emitting layer 130, and the second electrode 140 may be formed (S707). For example, the first electrode 120, the light emitting layer 130, and the second electrode 140 may be sequentially formed on the bank B and the second insulating film 114, as illustrated in FIG. 8H. The first electrode 120 may be formed on the bank B and the second insulating film 114. The first electrode 120 may be in the plurality of pixels P1, P2, and P3 without using a particular mask or photoresist. For example, the first electrode 120 may be formed using a physical vapor deposition (PVD) method, such as a sputtering method. The first electrode 120 may be self-aligned by the trench T and may be formed for each of the pixels P1, P2, and P3.

The first electrode 120 may be formed of a metal material having high reflectance such as silver (Ag). Alternatively, the first electrode 120 may be formed of a metal material having high reflectance, such as a stacked structure (Ti/Al/Ti) of aluminum and titanium, a stacked structure (ITO/Al/ITO) of aluminum and ITO, an APC alloy, or a stacked structure (ITO/APC/ITO) of an APC alloy and ITO. The APC alloy may be an alloy of silver (Ag), palladium (Pd), and/or copper (Cu).

Then, the fourth insulating film 125 may be formed to cover the end of the first electrode 120. The fourth insulating film 125 may be formed on the first electrode 120 that is on the side surface and the top surface of the bank B to cover the end of the first electrode 120. Then, the light emitting layer 130 may be formed on the first electrode 120. The light emitting layer 130 may be in the plurality of pixels P1, P2, and P3 without using a particular mask or photoresist. For example, the light emitting layer 130 may be formed using a deposition method or a solution method. The light emitting layer 130 may be self-aligned by the trench T, and may be formed for each of the pixels P1, P2, and P3.

On the other hand, the light emitting layer 130 may be a white light emitting layer. The light emitting layer 130 may be a common layer formed commonly to the pixels P1, P2, and P3. When the light emitting layer 130 may be a white light emitting layer, the light emitting layer 130 may be formed in a tandem structure of two or more stacks. Each stack may include a hole transporting layer, at least one light emitting layer, and an electron transporting layer.

A charge generating layer may be formed between the stacks. The charge generating layer includes an n-type charge generating layer that may be located adjacent to a lower stack, and a p-type charge generating layer that may be formed on the n-type charge generating layer and may be located adjacent to an upper stack. The n-type charge generating layer injects electrons to the lower stack, and the p-type charge generating layer injects holes to the upper stack. The n-type charge generating layer may be formed of an organic layer that may be doped with an alkali metal such as Li, Na, K, and/or Cs, or an alkali earth metal such as Mg, Sr, Ba, and/or Ra. The p-type charge generating layer may be formed of an organic material having hole transportability that may be doped with a dopant.

Then, the second electrode 140 may be formed on the light emitting layer 130. The second electrode 140 may be formed of a transparent conductive material (TCO) such as ITO or IZO that may transmit light or a semi-transmissive conductive material, such as magnesium (Mg), silver (Ag), and/or an alloy of magnesium (Mg) and silver (Ag). The second electrode 140 may be formed using a physical vapor deposition (PVD) method such as a sputtering method.

Figure 8I:
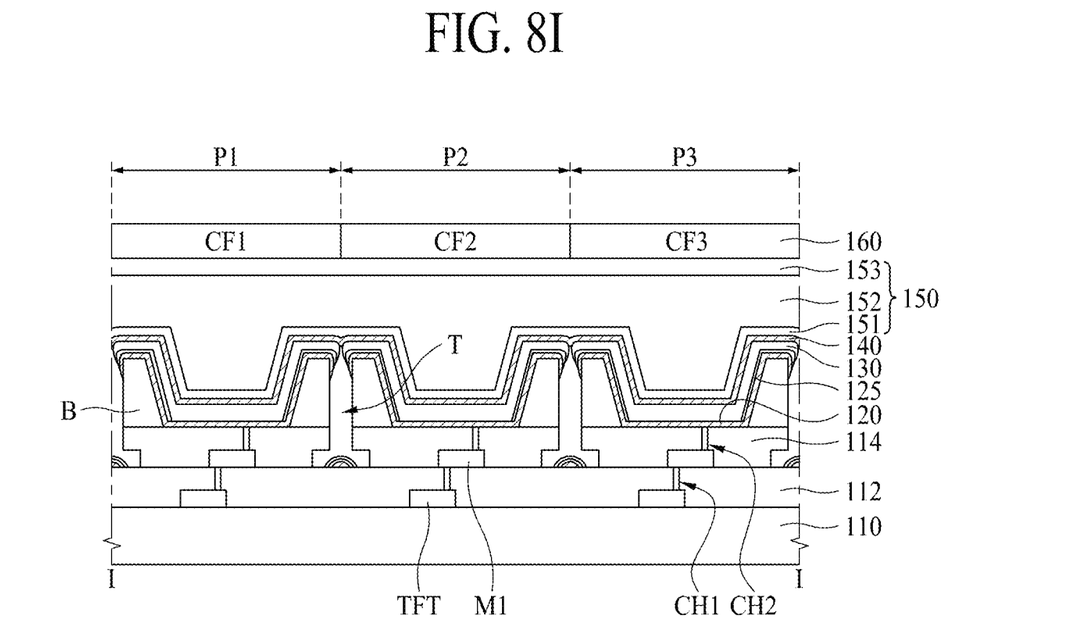

Then, the encapsulation film 150 and the color filter 160 may be formed (S708). For example, the first inorganic film 151 may be formed on the second electrode 140 as illustrated in FIG. 8I. The first inorganic film 151 may be formed of silicon nitride, aluminum nitride, zirconium nitride, titanium nitride, hafnium nitride tantalum nitride, silicon oxide, aluminum oxide, and/or titanium oxide. The first inorganic films 151 may be formed using a chemical vapor deposition (CVD) method or an atomic layer deposition (ALD) method.

Then, the organic film 152 may be formed on the first inorganic film 151. The organic film 152 may be formed of, for example, an acryl resin, an epoxy resin, a phenolic resin, a polyamide resin, and/or a polyimide resin. Then, the second inorganic film 153 may be formed on the organic film 152. The second inorganic film 153 may be formed of silicon nitride, aluminum nitride, zirconium nitride, titanium nitride, hafnium nitride tantalum nitride, silicon oxide, aluminum oxide, and/or titanium oxide. The second inorganic film 153 may be formed using a CVD method or an ALD method.

Then, the first color filter CF1, the second color filter CF2, and the third color filter CF3 may be formed on the second inorganic film 153. The first color filter CF1 may correspond to the first pixel P1, the second color filter CF2 may correspond to the second pixel, and the third color filter CF3 may correspond to the third pixel P3. In the display device 100, because the bank B may be formed after the trench T has been formed, the top area of the bank B can be minimized or reduced. Accordingly, with the display device 100, it is possible to maximize the aperture ratio of the pixels P1, P2, and P3. Unlike the present disclosure, to form the trench T penetrating the bank B after forming the bank B, a sufficient width may be secured on the top surface of the bank B, thus the aperture ratio of the pixels P1, P2, and P3 may be decreased.

Figure 9A:
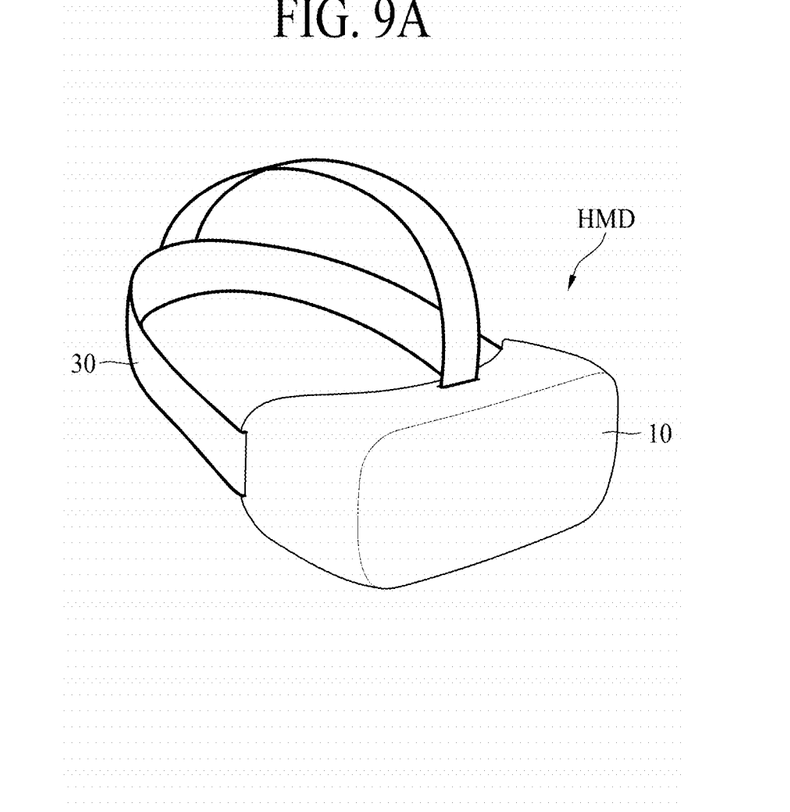
FIGS. 9A to 9C illustrate a head-mounted display (HMD) device employing a display device according to another example embodiment of the present disclosure.
Figure 9B:
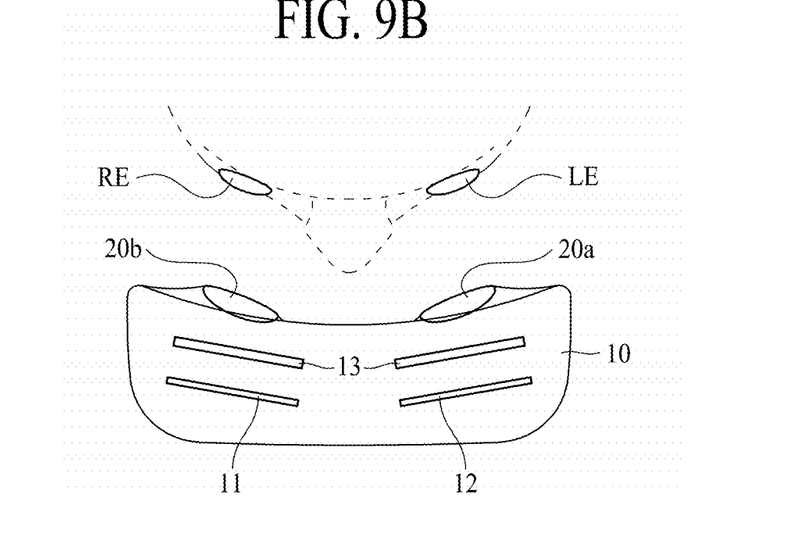
Figure 9C:
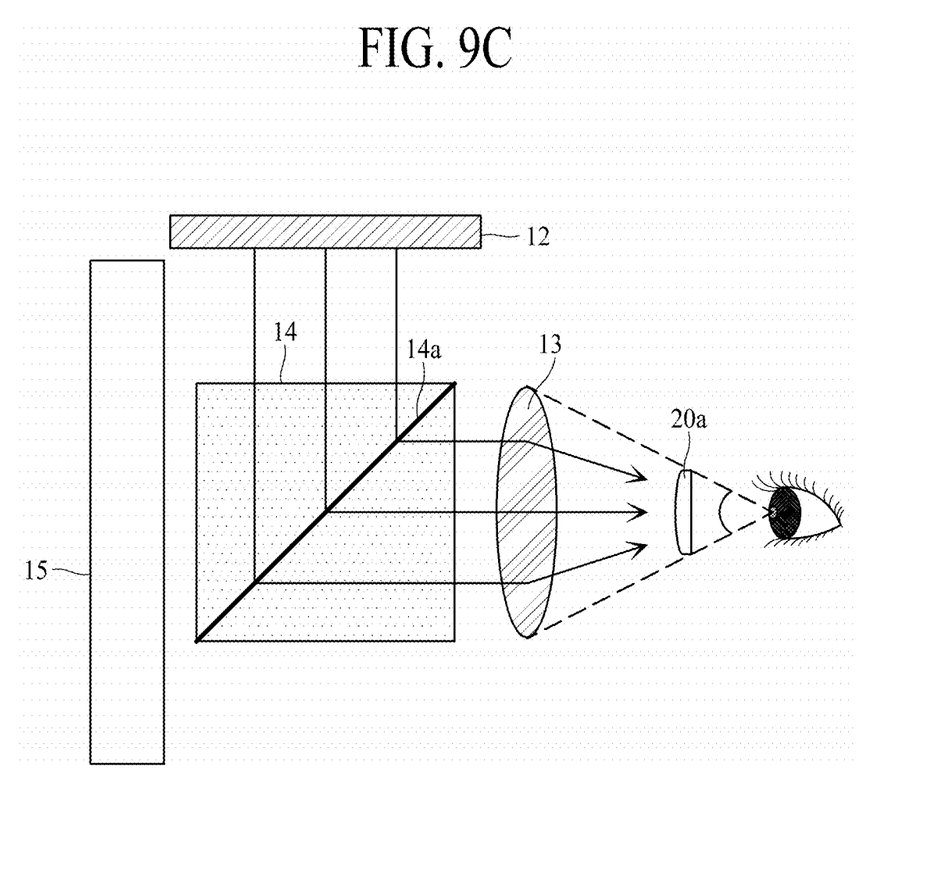

FIGS. 9A to 9C illustrate a head-mounted display (HMD) device employing a display device according to another example embodiment of the present disclosure. FIG. 9A is a perspective view, FIG. 9B is a plan view of a virtual reality (VR) structure, and FIG. 9C is a sectional view of an augmented reality (AR) structure. As illustrated in FIG. 9A, the head-mounted display device may include a storage case 10 and a head-mounted band 30. The storage case 10 may store a display device, a lens array, and an eyepiece.

The head-mounted band 30 may be fixed to the storage case 10. The head-mounted band 30 may surround the top and/or both side surfaces of a user's head. The head-mounted band 30 may fix the head-mounted display device to a user's head, and may be replaced with an eyeglass-shaped structure or a helmet-shaped structure. As illustrated in FIG. 9B, the head-mounted display device for VR may include a left-eye display device 12, a right-eye display device 11, a lens arrays 13, a left-eye eyepiece 20a, and a right-eye eyepiece 20b.

The left-eye display device 12, the right-eye display device 11, the lens arrays 13, the left-eye eyepiece 20a, and the right-eye eyepiece 20b may be stored in the storage case 10. The left-eye display device 12 and the right-eye display device 11 may display substantially the same image, and a user can watch a two-dimensional image. Alternatively, the left-eye display device 12 may display a left-eye image and the right-eye display device 11 may display a right-eye image, and a user can watch a three-dimensional image. Each of the left-eye display device 12 and the right-eye display device 11 may employ the display device illustrated in FIGS. 1 to 6. Accordingly, an upper part corresponding to the surface on which an image is displayed, for example, a color filter layer 160, may face the lens array 13.

The lens array 13 may be separated from the left-eye eyepiece 20a and the left-eye display device 12, and may be between the left-eye eyepiece 20a and the left-eye display device 12. The lens array 13 may be formed before the left-eye eyepiece 20a, and after the left-eye display device 12. The lens array 13 may be separated from the right-eye eyepiece 20b and the right-eye display device 11, and be disposed between the right-eye eyepiece 20b and the right-eye display device 11. The lens array 13 may be formed before the right-eye eyepiece 20b, and after the right-eye display device 11.

The lens array 13 may be microlens arrays. The lens array 13 may be replaced with a pin-hole array. An image displayed on the left-eye display device 12 or the right-eye display device 11 may be enlarged for a user by the lens array 13. A user's left eye LE may be located at the left-eye eyepiece 20a and the user's right eye RE may be located at the right-eye eyepiece 20b.

As illustrated in FIG. 9C, the head-mounted display device for augmented reality (AR) may include a left-eye display device 12, a right-eye display device 11, a left-eye eyepiece 20a, a transmissive/reflective portion 14, and a transmission window 15. A configuration on the left-eye side is illustrated in FIG. 9C, but a configuration on the right-eye side may be substantially the same as the configuration on the left-eye side. The left-eye display device 12, the lens array 13, the left-eye eyepiece 20a, the transmissive/reflective portion 14, and the transmission window 15 may be stored in the storage case 10.

The left-eye display device 12 may be disposed on one side of the transmissive/reflective portion 14, such as an upper side, such that the transmission window 15 may not be covered. Accordingly, the left-eye display device 12 may provide an image to the transmissive/reflective portion 14 while not covering the background through the transmission window 15. The left-eye display device 12 may employ the display devices illustrated in FIGS. 1 to 6. Here, an upper part corresponding to the surface on which an image may be displayed in FIGS. 1 to 6, for example, the color filter (not illustrated), faces the transmissive/reflective portion 14.

The lens array 13 may be disposed between the left-eye eyepiece 20a and the transmissive/reflective portion 14. A user's left eye may be located at the left-eye eyepiece 20a. The transmissive/reflective portion 14 may be disposed between the lens array 13 and the transmission window 15. The transmissive/reflective portion 14 may include a reflective surface 14a that transmits some light and reflects other light. The reflective surface 14a may be formed such that an image displayed on the left-eye display device 12 propagates to the lens array 13. Accordingly, a user may watch both an external background and an image displayed by the left-eye display device 12 through the transmission window 15. A user may watch a single image in which a real background and a virtual image may be superimposed, thus augmented reality can be realized. The transmission window 15 may be formed before the transmissive/reflective portion 14.

The above-described features, structure, and effect of the present disclosure are included in at least one example embodiment of the present disclosure, but are not limited to only one example embodiment. Furthermore, the features, structure, and effect described in at least one example embodiment of the present disclosure may be implemented through combination or modification of other example embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
a substrate;
a plurality of pixels on the substrate;
an insulating film on the substrate;
a transistor between the substrate and the insulating film;
a lower metal layer under the insulating film and connected to the transistor;
a bank on the insulating film, wherein the bank partitions the plurality of pixels;
a first trench in the bank; and
a second trench in the insulating film,
wherein the first trench has a first width, and the second trench has a second width greater than the first width, and
wherein the second trench is in a same layer as the lower metal layer.

2. The display device according to claim 1, further comprising a first electrode in each of the plurality of pixels, wherein a portion of the first electrode is on the bank.

3. The display device according to claim 2, wherein a portion of the first electrode is on a side surface and a top surface of the bank.

4. The display device according to claim 2, wherein a material of the first electrode is on a bottom surface of the second trench.

5. The display device according to claim 4, wherein the portion of the first electrode on the bank and the material of the first electrode on the bottom surface of the second trench are separated from each other.

6. The display device according to claim 2, further comprising a light emitting layer on the first electrode.

7. The display device according to claim 6, wherein a portion of the light emitting layer is on the portion of the first electrode on the side surface and the top surface of the bank.

8. The display device according to claim 7, wherein a material of the light emitting layer is on the portion of the first electrode on the bottom surface of the second trench.

9. The display device according to claim 8, wherein the portion of the light emitting layer on the side surface and top surface of the bank and the material of the light emitting layer on the bottom surface of the second trench are separated from each other.

10. The display device according to claim 6, further comprising a second electrode on the light emitting layer.

11. The display device according to claim 1, further comprising an etching preventing film between the insulating film and the bank.

12. The display device according to claim 11, wherein the first trench penetrates the bank and the etching preventing film.

13. The display device according to claim 1, further comprising:
a lens array that is separated from the substrate; and
a storage case configured to store the lens array.

14. A display device comprising:
a substrate;
a plurality of pixels on the substrate;
an insulating film on the substrate;
a bank on the insulating film, wherein the bank partitions the plurality of pixels;
a first electrode in each of the plurality of pixels, wherein a portion of the first electrode is directly on a side surface and a top surface of the bank;
a first trench in the bank; and
a second trench in the insulating film,
wherein the first trench has a first width, and the second trench has a second width greater than the first width.

* * * * *